United States Patent
Jeong et al.

(10) Patent No.: US 10,184,999 B2
(45) Date of Patent: Jan. 22, 2019

(54) RF COIL AND MAGNETIC RESONANCE IMAGING DEVICE INCLUDING THE RF COIL

(71) Applicant: SAMSUNG ELECTRONICS CO., LTD., Suwon-si (KR)

(72) Inventors: Man Ho Jeong, Suwon-si (KR); Byoung Mock Kahm, Hwaseong-si (KR); Ku Cheol Ahn, Guri-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 291 days.

(21) Appl. No.: 15/275,602

(22) Filed: Sep. 26, 2016

(65) Prior Publication Data

US 2017/0168126 A1   Jun. 15, 2017

(30) Foreign Application Priority Data

Dec. 11, 2015   (KR) .................. 10-2015-0177159

(51) Int. Cl.
  *G01R 33/34*   (2006.01)
  *G01R 33/30*   (2006.01)
  *G01R 33/341*  (2006.01)

(52) U.S. Cl.
  CPC ..... *G01R 33/34007* (2013.01); *G01R 33/307* (2013.01); *G01R 33/341* (2013.01); *G01R 33/34084* (2013.01)

(58) Field of Classification Search
  CPC ...... G01R 33/30; G01R 33/307; G01R 33/34; G01R 33/341; G01R 33/34; G01R 33/34007; G01R 33/34084; G01R 33/56375; G01R 33/3802; G01R 33/3858
  See application file for complete search history.

(56) References Cited

U.S. PATENT DOCUMENTS

| | | | |
|---|---|---|---|
| 5,066,915 A | 11/1991 | Omori et al. | |
| 2004/0030241 A1* | 2/2004 | Green | A61B 5/0555 600/422 |
| 2008/0186027 A1* | 8/2008 | Kassai | G01R 33/30 324/318 |

(Continued)

FOREIGN PATENT DOCUMENTS

| | | |
|---|---|---|
| JP | 2005523102 A | 8/2005 |
| JP | 2008005954 A | 1/2008 |

(Continued)

OTHER PUBLICATIONS

Communication dated Mar. 6, 2017, issued by the Korean Intellectual Property Office in counterpart Korean Application No. 10-2015-0177159.

(Continued)

*Primary Examiner* — Son Le
(74) *Attorney, Agent, or Firm* — Sughrue Mion, PLLC (57) ABSTRACT

A magnetic resonance imaging (MRI) device, including a transport table configured to slide; and a radio frequency (RF) coil configured to receive an RF signal, wherein the RF coil may include a main body; at least one fixer installed on the main body, the fixer being configured to contact the transport table; and a decompressor configured to reduce pressure between the at least one fixer and the transport table to detachably fix the main body onto the transport table.

20 Claims, 8 Drawing Sheets

(56) References Cited

U.S. PATENT DOCUMENTS

2009/0308400 A1   12/2009  Wilson et al.
2015/0168511 A1*  6/2015  Jeong ................. G01R 33/3415
                                                                          324/321

FOREIGN PATENT DOCUMENTS

| JP | 4751045 B2 | 8/2011 | |
|---|---|---|---|
| KR | 10-2013-0099886 A | 9/2013 | |
| KR | 10-2015-0069058 A | 6/2015 | |
| WO | WO 2013001377 A2 * | 1/2013 | ........... A61B 5/6835 |

OTHER PUBLICATIONS

Communication issued by the Korean Intellectual Property Office dated Jun. 1, 2017 in counterpart Application No. 10-2015-0177159.

* cited by examiner

RF COIL AND MAGNETIC RESONANCE IMAGING DEVICE INCLUDING THE RF COIL

CROSS-REFERENCE TO RELATED APPLICATION

This application claims priority from Korean Patent Application No. 10-2015-0177159, filed on Dec. 11, 2015, the disclosures of which is incorporated herein by reference in its entirety.

BACKGROUND

1. Field

The present disclosure relates to a radio frequency (RF) coil and magnetic resonance imaging device including the RF coil, and more particularly, to an RF coil and magnetic resonance imaging device including the RF coil with an improved structure for fixing the RF coil easily onto a transport table.

2. Discussion of Related Art

In general, a medical imaging apparatus acquires information about a patient and provides corresponding images. The medical imaging apparatus includes an X-ray device, an ultrasonic diagnostic device, a Computerized Tomography (CT) scanner, a Magnetic Resonance Imaging (MRI) device, and the like.

Among them, the MRI device is relatively free from image scanning conditions and provides excellent soft-tissue contrast and various diagnostic information images, thereby holding a key position in areas of diagnostics.

MRI is a medical technique to use magnetic fields that are harmless to human bodies and radio frequencies (RF) that are non-ionizing radiation, to cause nuclear magnetic resonance to the nuclei of hydrogen atoms in the body, thereby imaging the density and physicochemical properties of the atomic nuclei.

Specifically, the MRI device images an internal part of an object by supplying energy at a certain frequency while applying a magnetic field to the inside of the gantry and converting energy emitted from the atomic nuclei to a signal.

In this regard, an RF coil is used to receive the energy emitted from the atomic nuclei, and the RF coil may be arranged separately from the patient table. Generally, the RF coil may be kept separately from the patient table at ordinary times, and connected to the patient table to be used in MRI scanning.

If the RF coil is moved during an MRI scan, desired MRI images may not be obtained, so there is a need for an RF coil fixing structure to fix the RF coil. To prevent the RF coil from slipping, a substance with high friction, such as rubber is generally attached onto the bottom face of the RF coil. Furthermore, a base structure fixed onto a transport table may be used to prevent the movement of the RF coil. In the former case where the RF coil is used with the substance having high friction, such as rubber attached onto the bottom face, whether the RF coil is fixed may depend on whether the patient is conscious. For example, movement of the RF coil may be prevented during an MRI scan while the patient is conscious, but the RF coil may be moved by the movement of the patient during an MRI scan while the patent is unconscious. In the latter case where the RF coil is used with the base structure fixed onto the transport table, it is difficult to handle the RF coil due to increased weight of the RF coil. Furthermore, an MRI scan of the patient has to be performed on the transport table, a portion of which has different thickness increased due to the base structure, in which case the patient might complain about inconvenience.

SUMMARY

The present disclosure provides a radio frequency (RF) coil and magnetic resonance imaging (MRI) device including the RF coil with an improved structure to prevent movement of the RF coil through decompression during an MRI scan.

The present disclosure also provides an RF coil and MRI device including the RF coil with an improved structure to perform an MRI scan while effectively fixing the RF coil regardless of whether the patient is conscious.

The present disclosure also provides an RF coil and MRI device including the RF coil with an improved structure to be able to omit a base structure that might cause inconvenience to the patient due to a step formed on a transport table.

According to an aspect of an exemplary embodiment, a magnetic resonance imaging (MRI) device includes a transport table configured to slide; and a radio frequency (RF) coil configured to receive an RF signal, wherein the RF coil may include a main body; at least one fixer installed on the main body, the fixer being configured to contact the transport table; and a decompressor configured to reduce pressure between the at least one fixer and the transport table to detachably fix the main body onto the transport table.

The main body may include a bottom surface facing the transport table, and the at least one fixer may be configured to be installed on the bottom surface of the main body.

The at least one fixer may include a contact face configured to contact the transport table, and a plurality of holes formed on the contact face.

The at least one fixer may include a first frame configured to contact the transport table; and a second frame combined with the first frame, wherein an internal space is formed between the first and second frames.

The first frame may include a plurality of holes formed thereon.

The RF coil may further include a connector configured to connect the at least one fixer to the decompressor to allow a movement of air between the at least one fixer and the transport table, one end of the connector being connected to a combining boss formed in the second frame.

The at least one fixer may include a nonmagnetic substance.

The at least one fixer may include at least one from among ceramic and thermosetting resin.

The at least one fixer may be configured to detachably connect to the decompressor.

The RF coil further may include a connector configured to detachably connect the at least one fixer to the decompressor to allow a movement of air between the at least one fixer and the transport table.

The connector further may include: a valve configured to control the movement of the air toward the decompressor.

The connector may include a first connector configured to connect the decompressor to the valve; and a second connector configured to connect the at least one fixer to the valve, wherein the first connector is detachably connected to the valve.

The MRI device may further include a magnet assembly having a cavity into which the transport table is configured to slide, wherein the RF coil further may include a connector configured to connect the at least one fixer to the decompressor by passing through at least one from among the magnet assembly and the transport table to allow a movement of air between the at least one fixer and the transport table.

The RF coil may include a connector configured to connect the at least one fixer to the decompressor to allow a movement of air between the at least one fixer and the transport table; and a cable configured to connect to an outlet for receiving power, wherein the connector may be configured to be inserted into the cable such that the cable is connected to the outlet, the fixer, and the decompressor simultaneously.

According to another aspect of an exemplary embodiment, a radio frequency (RF) coil includes a main body configured to receive an RF signal, the main body forming the exterior of the RF coil; at least one fixer installed on the main body, wherein a portion of the at least one fixer is exposed to an outer surface of the main body; and a decompressor connected to the at least one fixer, the decompressor being configured to detachably fix the main body onto a target face by decompressing the at least one fixer.

The main body may include a bottom surface facing the target face, and the at least one fixer may be installed on the bottom surface of the main body.

The at least one fixer may include a contact face configured to contact the target face, and a plurality of holes formed on the contact face.

The at least one fixer may include a nonmagnetic substance.

The at least one fixer may include at least one from among ceramic and thermosetting resin.

The at least one fixer may be configured to detachably connect to the decompressor.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Reference will now be made in detail to exemplary embodiments, examples of which are illustrated in the accompanying drawings, wherein like reference numerals refer to the like elements throughout. The terms "front", "rear", "upper", "lower", "top", and "bottom" as herein used are defined with respect to the drawings, but the terms may not restrict the shape and position of the respective components.

Figure 1:
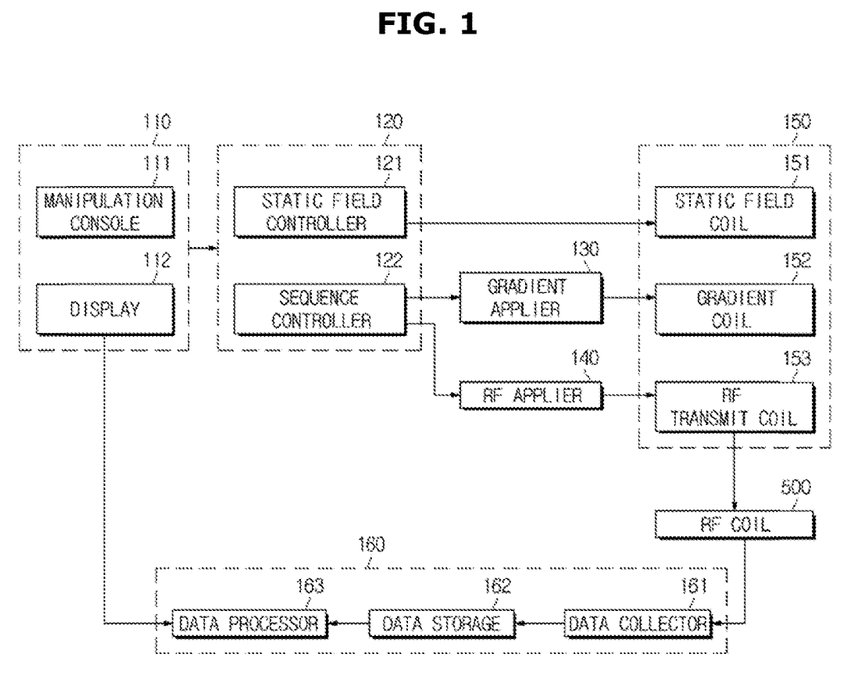
FIG. 1 is a control block diagram of a magnetic resonance imaging (MRI) device, according to an exemplary embodiment of the present disclosure.

FIG. 1 is a control block diagram of a magnetic resonance imaging (MRI) device, according to an exemplary embodiment of the present disclosure. General operation of a magnetic resonance imaging (MRI) device will now be described with reference to FIG. 1. Especially, it is assumed herein that a radio frequency (RF) coil is separated from a magnet assembly.

Referring to FIG. 1, an MRI device in accordance with an exemplary embodiment of the present disclosure may include a magnet assembly 150 for producing magnetic fields and causing resonance to atomic nuclei, a controller 120 for controlling operation of the magnet assembly 150, and an image processor 160 for creating a magnetic resonance image based on echo signals, i.e., magnetic resonance signals originated from the atomic nuclei. The MRI device may also include an RF coil 500 for receiving a magnetic resonance signal generated by the magnet assembly 150 and forwarding the magnetic resonance signal to the image processor 160.

The magnet assembly 150 may include a static field coil 151 for producing a static field in its internal space, a gradient coil 152 for producing a gradient field by producing a gradient to the static field, and an RF transmitter coil 153 for applying RF pulses. For example, if an object is located in the internal space of the magnet assembly 150, a static field, a gradient field, and an RF pulse may be applied to the object. The RF pulse applied excites nuclei of atoms that make up the object, and echo signals are generated from the nuclei.

The RF coil 500 may receive electromagnetic waves, i.e., magnetic resonance signals emitted from the excited atomic nuclei. In this case, the RF coil 500 serves as an antenna to receive RF signals emitted from the object. The RF coil 500 is often attached onto the human body, so it is common for the RF coil 500 to be customized to the shape of each part of the human body and thus include a head coil, a neck coil, a back coil, a knee coil, etc.

As an example of the RF coil 500 that is separable from the magnet assembly 150, there is a surface coil for receiving excited magnetic resonance signals from a part of the object. Compared to a volume coil, the surface coil is relatively small in size and has the form of a two dimensional (2D) plane, so the surface coil has significantly high signal to noise ratio (SNR) for an adjoining part.

As another example of the RF coil 500, there may be an array coil that widens the receiving range by arraying a number of surface coils in one dimension (1D) or 2D. The array coil may have different array forms depending on the part to be scanned, and may be classified into one for head, one for head and neck, one for breasts, one for spine, one for abdomen, one for legs, etc. Since relative positions of the surface coils that make up the array coil are different, phases of signals received by the surface coils are also different. Accordingly, an image with a high SNR may be acquired by taking into account receive phases of the surface coils in reconstructing the image by combining the signals received by the surface coils.

The controller 120 may include a static field controller 121 for controlling strength and direction of a static field produced by the static field coil 151, and a pulse sequence controller 122 for designing a pulse sequence to control the gradient coil 152 and the RF transmit coil 153.

The MRI device 100 may include a gradient applier 130 for applying a gradient signal to the gradient coil 152 and an RF applier 140 for applying an RF signal to the RF transmit coil 153. The pulse sequence controller 122 may control the gradient applier 130 and RF applier 140 to regulate a gradient magnetic field produced in the internal space of the magnet assembly 150 and an RF to be applied to atomic nuclei.

The RF coil 500 is connected to the image processor 160. The image processor 160 may include a data collector 161 for receiving data about a spin echo signal, i.e., a magnetic resonance signal originated from the atomic nuclei, a data storage 162 for storing data received from the data collector 161, and a data processor 163 for processing the stored data to create a magnetic resonance image.

The data collector 161 may include a preamplifier for amplifying a magnetic resonance signal received by the RF coil 500, a phase detector for detecting a phase from the magnetic resonance signal sent from the preamplifier 161, an analog-to-digital (A/D) converter for converting an analog signal obtained by the phase detector to a digital signal. The data collector 161 may also send the digitally converted magnetic resonance signal to the data storage 162.

A data space, which corresponds to a 2D Fourier space, is formed in the data storage 162, and once the whole scanned data has been stored, the data processor 163 may reconstruct an image of an object by performing 2D inverse Fourier transformation on the data in the 2D Fourier space. The reconstructed image may be displayed on a display 112.

Furthermore, the MRI device 100 may include a user manipulator 110 to receive control commands from the user for general operation of the MRI device 100, and especially, receive a command about a scan sequence from the user to generate a pulse sequence accordingly.

The user manipulator 110 may include a manipulation console 111 equipped for the user to manipulate the system, and the display 112 for displaying an image created by the image processor 160 so that the user may diagnose health conditions of the object.

Figure 2:
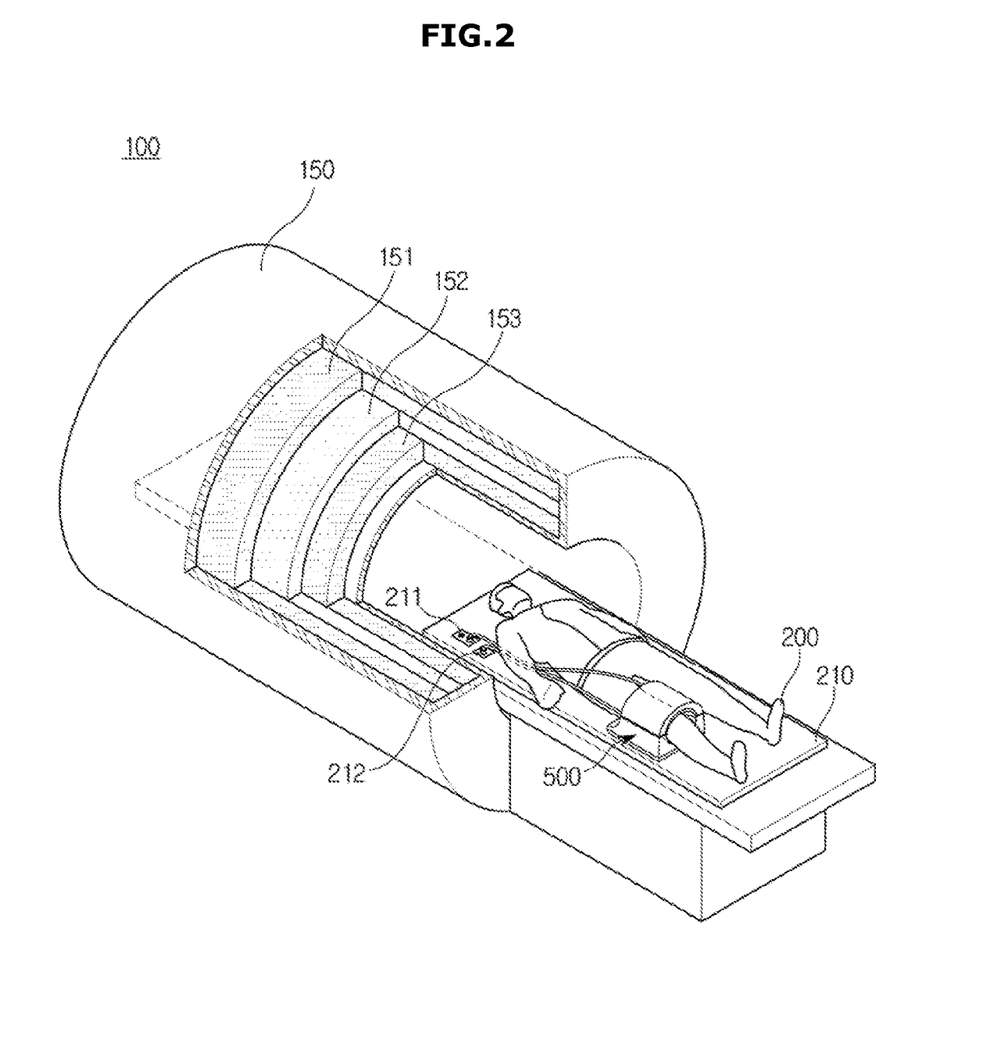
FIG. 2 schematically shows the exterior of an MRI device, according to an exemplary embodiment of the present disclosure.

FIG. 2 schematically shows an MRI device, according to an exemplary embodiment of the present disclosure.

Referring to FIG. 2, the magnet assembly 150 has a cylindrical form with its internal space empty, and is also called a gantry or bore. The internal space of the magnet assembly 150 is called a cavity, and a transport table 210 may slide into and out of the cavity. The transport table 210 may transport an object 200 laying thereon into the cavity to obtain magnetic resonance signals.

The magnet assembly 150 may include a static field coil 151, a gradient coil 152, and an RF transmit coil 153.

The static field coil 151 may have a form in which a coil winds around the cavity. When a current is applied to the static field coil 151, a static field is produced in the internal space, i.e., the cavity of the magnet assembly 150. Once the static field is produced in the cavity, nuclei of atoms that make up the object, especially nuclei of hydrogen atoms, are aligned in the direction of the static field, and precess about the direction of the static field.

The gradient coil 152 produces a gradient field or gradient magnetic field by producing a gradient to the static field formed in the cavity.

Figure 3:
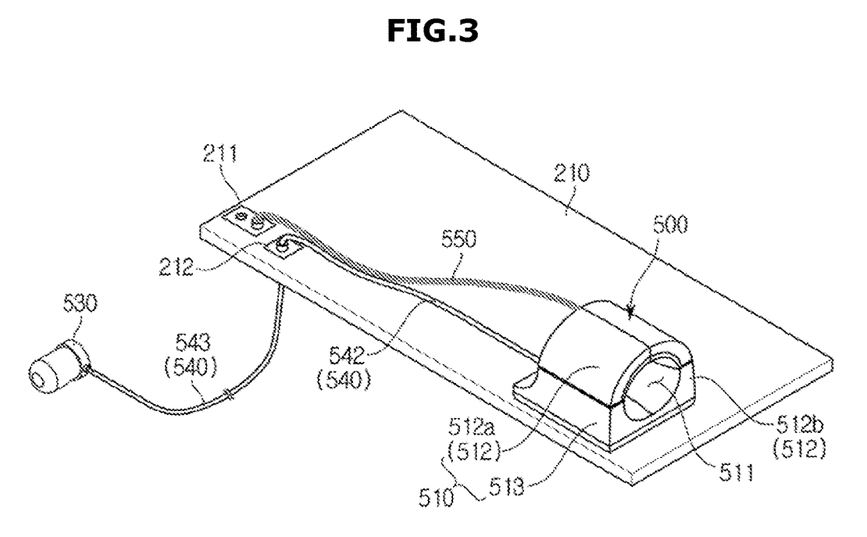
FIG. 3 is a perspective view of a radio frequency (RF) coil of an MRI device, according to an exemplary embodiment of the present disclosure.
Figure 4:
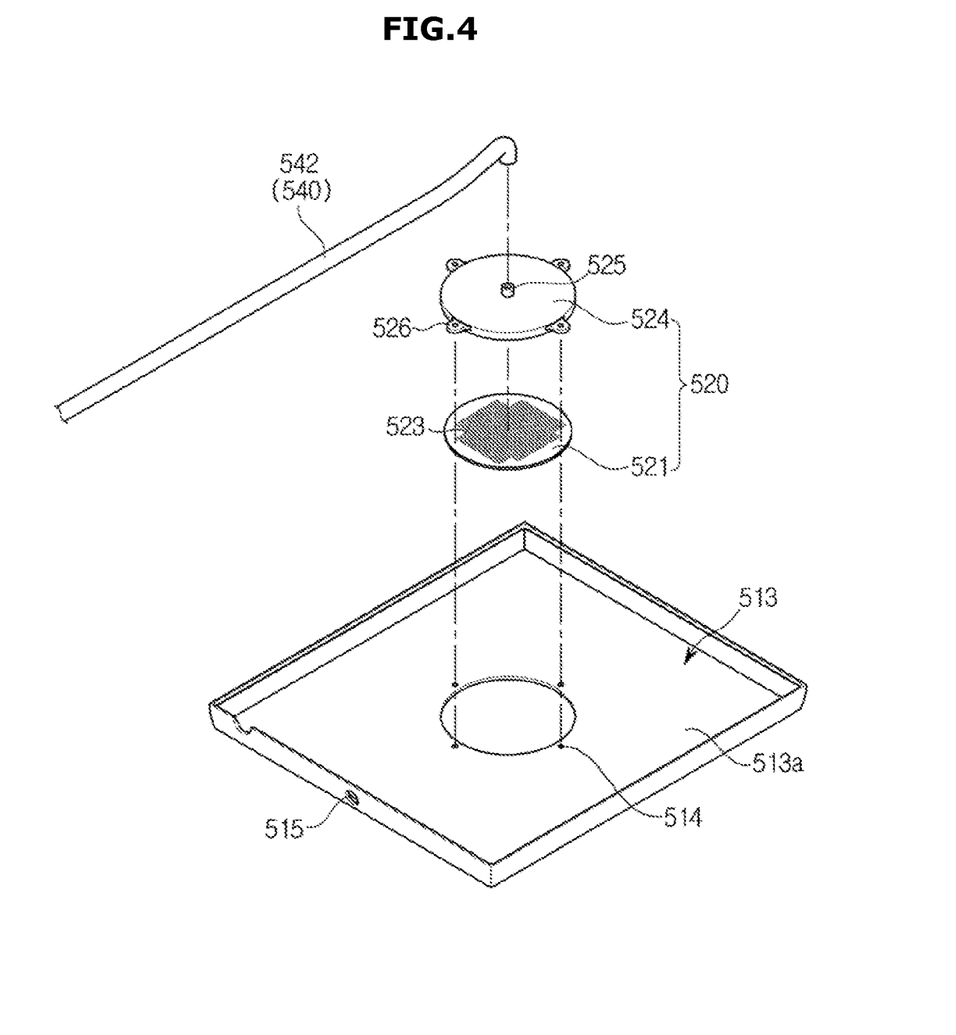
FIG. 4 is an exploded view of a part of the RF coil shown in FIG. 3, according to an exemplary embodiment of the present disclosure.
Figure 5:
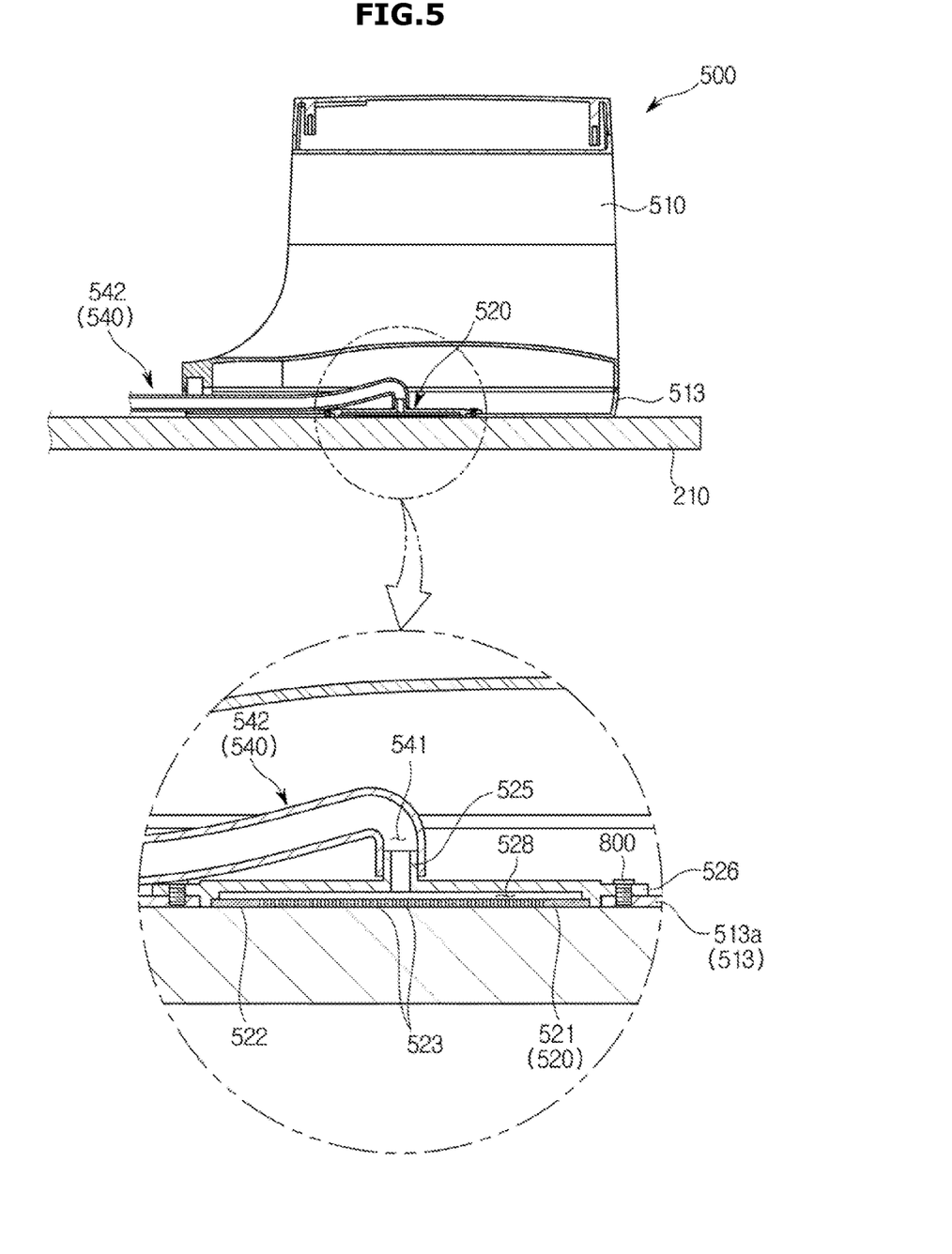
FIG. 5 is a cross-sectional view of at least one fixer of the RF coil shown in FIG. 3 fixed onto a transport table, according to an exemplary embodiment of the present disclosure.

FIG. 3 is a perspective view of an RF coil of an MRI device, according to an exemplary embodiment of the present disclosure, and FIG. 4 is an exploded view of a part of the RF coil shown in FIG. 3, according to an exemplary embodiment of the present disclosure. FIG. 5 is a cross-sectional view of at least one fixer of the RF coil shown in FIG. 3 fixed onto a transport table, according to an exemplary embodiment of the present disclosure. The RF coil 500 may be put on a target face. Specifically, the main body 510 of the RF coil 500 may be put on the target face. In the following description, it is assumed that the target face corresponds to the transport table 210.

As shown in FIGS. 3 to 5, the RF coil 500 may include the main body 510. The main body 510 may receive RF signals. The main body 510 may form the exterior of the RF coil 500. The main body 510 may cover or accommodate a part of the object to be scanned. For example, the RF coil 500 shown in FIGS. 2 to 8 is an RF coil for knee to scan a knee of the object, in which case the part of the object, i.e., a knee to be scanned may be put into the cavity 511 formed in the main body 510.

The main body 510 may include a first casing 512 within which the cavity 511 is formed and a second casing 513 combined with the first casing 512. The second casing 513 may be combined on the bottom of the first casing 512. The second casing 513 may include a bottom surface 513a that meets the transport table 210.

The first casing 512 may include a top casing 512a and a bottom facing 512b combined together to form the cavity 511 within. The top casing 512a and the bottom casing 512b may be detachably combined to easily put a part of the object to be scanned into the cavity 511.

The second casing 513 may be combined with the bottom casing 512b. The second casing 513 may be detachably combined with the bottom casing 512b. Alternatively, the second casing 513 may be integral with the bottom casing 512b.

The RF coil 500 may further include at least one fixer 520. It is desirable that the RF coil 500 may further include a plurality of fixers 520. If the plurality of fixers 520 are used, the posture of the patient may be fine-tuned by controlling the respective fixers 520. Furthermore, using the plurality of fixers 520 may ensure relatively tighter contact with the transport table 210 than using only one fixer 520, and thus effectively prevent twist or movement of the main body 510 of the RF coil 500. The at least one fixer 520 may be installed in the main body 510. The at least one fixer 520 may be installed in the main body 510 to be able to come into contact with the transport table 210. Specifically, the at least one fixer 520 may be installed on the bottom surface 513a of the main body 510 to be able to come into contact with the transport table 210. In other words, the at least one fixer 520 may be installed on the bottom surface 513a of the second casing 513 to be able to come into contact with the transport table 210.

Explaining this from a different perspective, the at least one fixer 520 may be installed in the main body 510 such that a part of the at least one fixer 520 is exposed to the outside of the main body 510.

The at least one fixer 520 may include a contact face 522 that comes into contact with the transport table 210. A plurality of holes 523 may be formed in the contact face 522. The plurality of holes 523 may each have a diameter of 0.01 mm to 2 mm, without being limited thereto.

Explaining this from a different perspective, the at least one fixer 520 may include a first frame 521 and a second frame 524. The first frame 521 may come into contact with the transport table 210. The second frame 524 may be combined with the first frame 521 to form an internal space 528 with the first frame 521. The first frame 521 may include the contact face 522 that comes into contact with the transport table 210. The plurality of holes 523 may be formed in the contact face 522 of the first frame 521. A combining boss 525 to which a connector 540 is connected may be formed in the second frame 524. A plurality of fasteners 526 may also be formed in the second frame 524. The plurality of fasteners 526 may be formed to protrude from the second frame 524 along the surroundings of the second frame 524. The at least one fixer 520 may be fixedly combined onto the bottom surface 513a of the main body 510, i.e., of the second casing 513 by a plurality of fixing members 800 penetrating the plurality of fasteners 526 and a plurality of fastening holes 514 formed on the bottom surface 513a of the second casing 513 in order.

The at least one fixer 520 may be formed of a substance available for laser beam machining.

The at least one fixer 520 may be formed of a nonmagnetic substance. The reason of using the nonmagnetic substance for the at least one fixer 520 is to prevent it from affecting the magnetic field produced in the magnet assembly 150.

The at least one fixer 520 may be formed of at least one of ceramic and thermosetting resin. The thermosetting resin may include e.g., melamine, phenol, or epoxy resin.

The at least one fixer 520 may be detachably combined with a decompressor 530.

The RF coil 500 may further include the decompressor 530. The decompressor 530 serves to reduce pressure between the at least one fixer 520 and the transport table 210 in order to detachably fix the main body 510 onto the transport table 210. Explaining this from a different perspective, the decompressor 530 serves to decompress the at least one fixer 520 in order to detachably fix the main body 510 onto the transport table 210.

The decompressor 530 may include a vacuum pump.

The decompressor 530 and the at least one fixer 520 may be combined indirectly with each other. Specifically, the decompressor 530 and the at least one fixer 520 may be combined by the connector 540.

The RF coil 500 may further include the connector 540. The connector 540 may connect the at least one fixer 520 and the decompressor 530 such that the air between the at least one fixer 520 and the transport table 210 moves. One end of the connector 540 facing toward the at least one fixer 520 may be connected to the combining boss 525 formed in the second frame 524.

The connector 540 may be formed of an elastic and flexible substance. For example, the connector 540 may be formed of a rubber material.

A fluid path 541 for airflow may be formed inside the connector 540.

The connector 540 may connect the at least one fixer 520 and the decompressor 530 by passing through at least one of the magnet assembly 150 and the transport table 210 in order to allow movement of the air between the at least one fixer 520 and the transport table 210. For example, FIGS. 2 and 3 show a case where the connector 540 connects the at least one fixer 520 and the decompressor 530 by passing through the transport table 210. The connector 540 may be combined with a connector nozzle 212 equipped in the transport table 210.

The combining relation between the connector 540 and the connector nozzle 212 will now be described in more detail.

The connector 540 may detachably connect the at least one fixer 520 and the decompressor 530 to allow movement of the air between the at least one fixer 520 and the transport table 210.

The connector 540 may include a first connector 542 and a second connector 543. The first and second connectors 542 and 543 may be detachably connected. The first connector 542 connects the at least one fixer 520 and the connector nozzle 212. The second connector 543 connects the decompressor 530 and the connector nozzle 212. The first connector 542 may be detachably combined with the connector nozzle 212 while being connected to the at least one fixer 520. The second connector 543 may remain in the state of connecting the decompressor 530 and the connector nozzle 212. If the decompressor 530 is activated while the first connector 542 is combined with the connector nozzle 212, the air between the at least one fixer 520 and the transport table 210 passes through the first and second connectors 542 and 543 in order, and is discharged through the decompressor 530. This may enable the contact face between the at least one fixer 520 and the transport table 210 to be decompressed, and enable the main body 510 of the RF coil 500 to be fixed onto the transport table 210.

The RF coil 500 may further include a cable 550. The cable 550 may electrically connect the main body 510 of the RF coil 500 and a power source. The cable 550 may also electrically connect the main body 510 of the RF coil 500 and the image processor 160 (see FIG. 1).

In the case that the cable 550 electrically connects the main body 510 of the RF coil 500 to the power source, the cable 550 may be coupled to an outlet 211 for receiving power. For example, the outlet 211 may be equipped on the transport table 210.

The connector 540 may be combined with the connector nozzle 212 separately from the cable 550, or may be inserted into the cable 550 such that the cable 550 is connected to the outlet 211 while connecting the at least one fixer 520 and the decompressor 530.

A procedure of using the decompressor 530 to fix the main body 510 of the RF coil 500 onto the transport table 210 will now be described in detail.

The connector 540 is combined with the connector nozzle 212. Specifically, the first connector 542 is combined with the connector nozzle 212. With the combination between the first connector 542 and the connector nozzle 212, the at least one fixer 520 and the decompressor 530 are connected. After this, if the decompressor 530 is activated, the air between the at least one fixer 520 and the transport table 210 flows to an internal space 528 of the at least one fixer 520 through the plurality of holes 523 formed in the at least one fixer 520 and is discharged out of the decompressor 530 through the connector 540. If the contact face between the at least one fixer 520 and the transport table 210 is decompressed by activation of the decompressor 530, the main body 510 of the RF coil 500 is fixed onto the transport table 210.

The decompressor 530 may be activated in conjunction with the cable 550. For example, coupling the cable 550 with the outlet 211 while the at least one fixer 520 and the decompressor 530 are connected by the connector 540 leads to automatic activation of the decompressor 530. On the contrary, decoupling the cable 550 from the outlet 211 may lead to automatic deactivation of the decompressor 530. Another example where the connector 540 is inserted into the cable 550 will be focused in the following description.

Specifically, the case where the first connector 542 is inserted into the cable 550 will now be focused. If the cable 550 is coupled with the outlet 211, the first connector 542 inserted into the cable 550 is connected to the second connector 543 and the at least one fixer 520 and the decompressor 530 are connected to each other, which leads to automatic activation of the decompressor 530. On the contrary, if the cable 550 is decoupled from the outlet 210, the first connector 542 is disconnected from the second connector 543 and the at least one fixer 520 and the decompressor 530 are also disconnected from each other, which leads to automatic deactivation of the decompressor 530.

The decompressor 530 may be activated separately from the cable 550. While the at least one fixer 520 and the decompressor 530 are connected by the connector 540, only the decompressor 530 may be activated separately from the cable 550. For example, there may be a dedicated switch for the decompressor 530 used to turn on/off the decompressor 530 separately from the cable 550.

Pressure of the contact face between the at least one fixer 520 and the transport table 210 or pressure in the internal space 528 of the at least one fixer 520 may be measured. If the pressure rises, the decompressor 530 may be automatically activated. This may effectively prevent the main body 510 of the RF coil 500 from moving when the decompression state applied to the contact face between the at least one fixer 520 and the transport table 210 is broken during an MRI scan.

Figure 6:
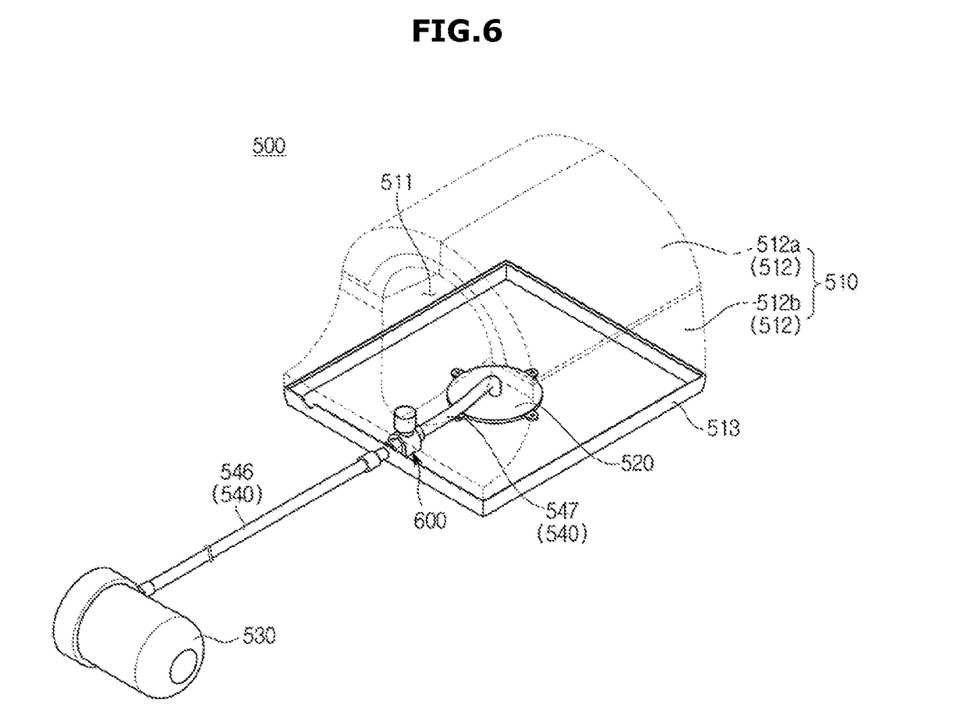
FIG. 6 is a perspective view of an RF coil of an MRI device, according to another exemplary embodiment of the present disclosure.

FIG. 6 is a perspective view of an RF coil of an MRI device, according to another exemplary embodiment of the present disclosure. Overlapping description with the RF coil 500 will be omitted herein. Reference numerals not shown may be referred to from FIGS. 1 to 5.

Referring to FIG. 6, the at least one fixer 520 may be detachably combined with the decompressor 530.

An RF coil 500*a* may further include the connector 540 for detachably connecting the at least one fixer 520 and the decompressor 530 to allow movement of the air between the at least one fixer 520 and the transport table 210.

On the connector 540, there may be a valve 600 installed to control flow of the air moving from between the at least one fixer 520 and the transport table 210 toward the decompressor 530.

The valve 600 may include a check valve, a solenoid valve, or the like.

The connector 540 may include a first connector 546 and a second connector 547. The first connector 546 connects the decompressor 530 and the valve 600. The second connector 547 connects the at least one fixer 520 and the valve 600. One end of the second connector 547 facing toward the at least one fixer 520 may be combined to the combining boss 525 of the at least one fixer 520. The first connector 546 may be detachably coupled to the valve 600 while being connected to the decompressor 530. The second connector 547 may remain in the state of connecting the at least one fixer 520 and the valve 600.

It is desirable for the valve 600 to be installed on the connector 540 to be positioned inside the main body 510. In this regard, one end of the first connector 546 facing toward the valve 600 may pass through a via hole 515 (see FIG. 4) formed on one side of the second casing 513 to be coupled with the valve 600 positioned inside the main body 510.

As such, the valve 600 installed on the connector 540 may enable the at least one fixer 520 and the decompressor 530 to be decoupled after the contact face between the at least one fixer 520 and the transport table 210 is decompressed by the decompressor 530, thereby more easily handling the RF coil 500*a*, especially the main body 510 of the RF coil 500*a*.

Even if the decompressor 530 and the at least one fixer 520 are decoupled, the valve 600 installed on the connector 540 may keep the contact face between the at least one fixer 520 and the transport table 210 in the decompressed state.

Figure 7:
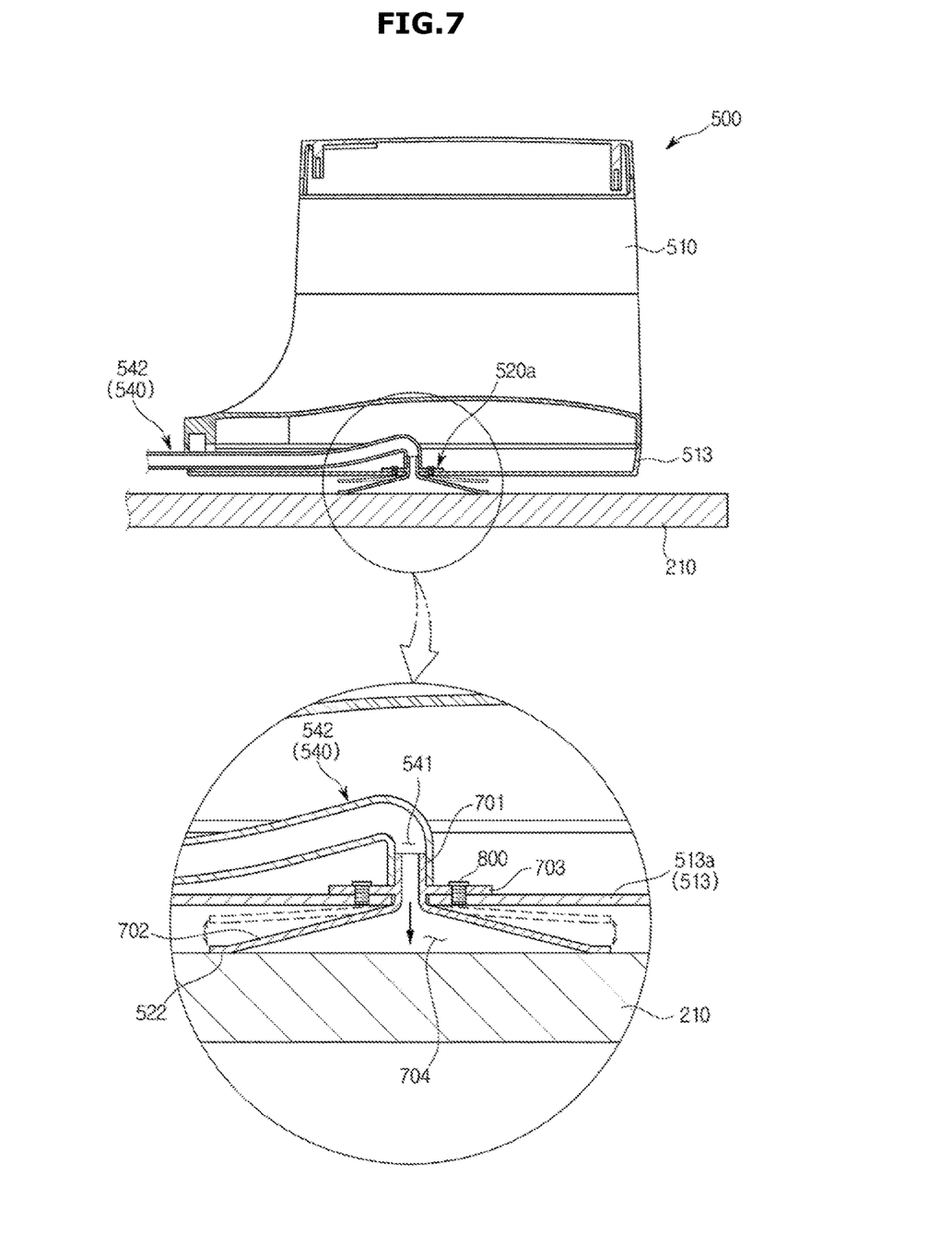
FIG. 7 shows a relation between a transport table and at least one fixer of an RF coil according to another exemplary embodiment of the present disclosure.

FIG. 7 shows a relation between a transport table and at least one fixer of an RF coil according to another exemplary embodiment of the present disclosure. Overlapping description with the RF coil 500 will be omitted herein. Reference numerals not shown may be referred to from FIGS. 1 to 5.

Referring to FIG. 7, an RF coil 500*b* may include at least one fixer 520*a* installed in the main body 510 to be able to come into contact with the transport table 210.

The at least one fixer 520*a* may include a suction cap.

At least a portion of the at least one fixer 520*a* may be formed of an elastic and flexible substance. It is desirable that a body 702 of the at least one fixer 520*a* may be formed of an elastic and flexible substance.

The at least one fixer 520*a* may include a head 701 and the body 702. The at least one fixer 520*a* may be installed in the main body 510 such that the body 702 is exposed to the outside. Specifically, the at least one fixer 520*a* may be installed on the bottom surface 513*a* of the main body 510 such that the body 702 is able to comes into contact with the transport table 210. The body 702 may come into contact with the transport table 210 and may be elastically deformed. The head 701 may be formed to protrude from the body 702. The head 701 may be combined with the connector 540. The body 702 tightly contacts the transport table 210 to form a decompression space 704. The decompression space 704 is decompressed by activation of the decompressor 530, and the main body 510 of the RF coil 500*b* is fixed onto the transport table 210.

A procedure of fixing the main body 510 of the RF coil 500*b* onto the transport table 210 will now be described in detail.

If the decompressor 530 is activated, the air inside the decompression space 704 passes through the head 701 of the at least one fixer 520*a* and flows into the connector 540. The air flowing into the connector 540 is discharged through the decompressor 530. As a result, the decompression space 704 is decompressed, and the main body 510 of the RF coil 500*b* is fixed onto the transport table 210.

The at least one fixer 520*a* may further include a neck 703. The neck 703 may extend from the head 701 in the width direction of the body 702. The at least one fixer 520*a* may be fixedly combined onto the bottom surface 513*a* of the main body 510, i.e., of the second casing 513 by a plurality of fixing members 800 penetrating the neck 703 and the plurality of fastening holes 514 formed on the bottom surface 513*a* of the second casing 513 in order.

Figure 8:
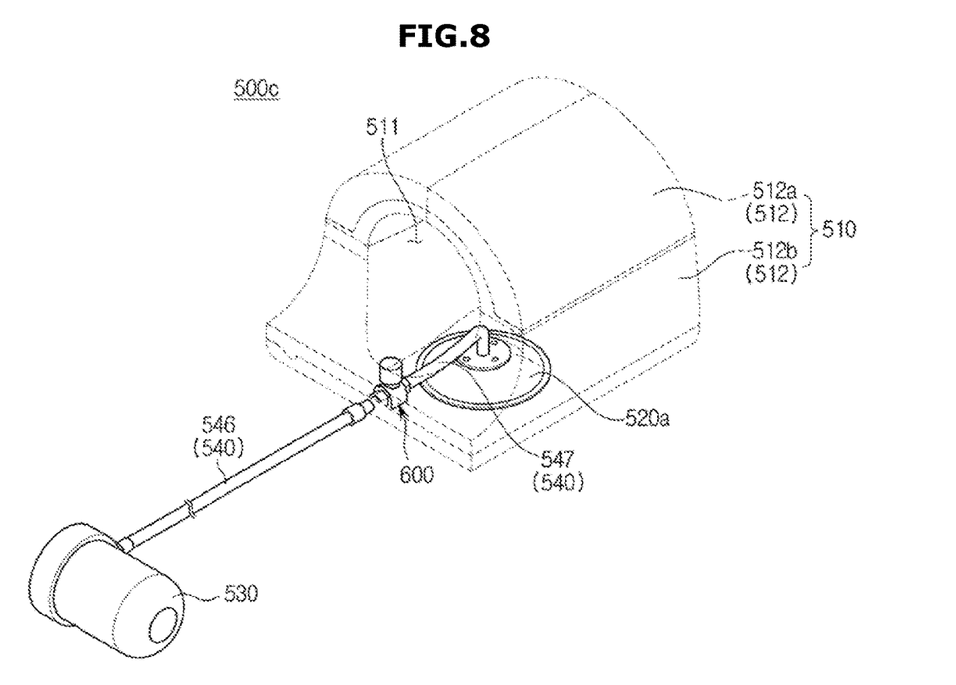
FIG. 8 is a perspective view of an RF coil of an MRI device, according to another exemplary embodiment of the present disclosure.

FIG. 8 is a perspective view of an RF coil of an MRI device, according to another exemplary embodiment of the present disclosure. Overlapping description with the RF coils 500, 500*a*, and 500*b* will be omitted herein. Reference numerals not shown may be referred to from FIGS. 1 to 5, and FIG. 7.

Referring to FIG. 8, even if the at least one fixer 520*a* is a suction cap, the valve 600 may be installed on the connector 540 as shown in FIG. 6.

The valve 600 may include a check valve, a solenoid valve, or the like.

As such, the valve 600 installed on the connector 540 may enable the at least one fixer 520*a* and the decompressor 530 to be decoupled after the decompression space 704 is decompressed by the decompressor 530, thereby more easily handling the RF coil 500c, especially, the main body 510 of the RF coil 500c.

Even if the decompressor 530 and the at least one fixer 520a are decoupled, the valve 600 installed on the connector 540 may keep the decompression space 704 in the decompressed state.

Although the above description has focused on an RF coil for knee, exemplary embodiments of the present disclosure for fixing the main body of an RF coil onto the transport table through decompression may be applied not only to the RF coil for knee but also to any kind of RF coils to be put and used on the transport table, such as RF coils for shoulder, wrist, foot, etc.

According to exemplary embodiments of the present disclosure, the main body of an RF coil may be easily fixed on a transport table by decompressing at least one fixer installed in the main body.

At least one fixer that may be decompressed by a decompressor may be used, instead of the base structure to form a step on the transport table, to fix the main body of the RF coil onto the transport table, thereby relieving inconvenience caused to the patient on the transport table during an MRI scan.

Since the main body of the RF coil may be firmly fixed onto the transport table through decompression of the at least one fixer, movement of the RF coil may be prevented during an MRI scan even if the MRI scan is performed on an unconscious patient.

Furthermore, the RF coil may be designed such that the decompressor may be decoupled from the at least one fixer when the at least one fixer is decompressed, thereby enabling the RF coil to be more easily handled.

Several exemplary embodiments have been described above, but a person of ordinary skill in the art will understand and appreciate that various modifications can be made without departing the scope of the present disclosure. Thus, it will be apparent to those ordinary skilled in the art that the true scope of technical protection is only defined by the following claims.

What is claimed is:

1. A magnetic resonance imaging (MRI) device comprising:
   a transport table configured to slide; and
   a radio frequency (RF) coil configured to receive an RF signal,
   wherein the RF coil comprises
      a main body;
      at least one fixer installed on the main body, the fixer being configured to contact the transport table; and
      a decompressor configured to reduce pressure between the at least one fixer and the transport table to detachably fix the main body onto the transport table.

2. The MRI device of claim 1,
   wherein the main body comprises a bottom surface facing the transport table, and
   wherein the at least one fixer is configured to be installed on the bottom surface of the main body.

3. The MRI device of claim 1,
   wherein the at least one fixer comprises a contact face configured to contact the transport table, and a plurality of holes formed on the contact face.

4. The MRI device of claim 1,
   wherein the at least one fixer comprises:
      a first frame configured to contact the transport table; and
      a second frame combined with the first frame,
   wherein an internal space is formed between the first and second frames.

5. The MRI device of claim 4,
   wherein the first frame comprises a plurality of holes formed thereon.

6. The MRI device of claim 4,
   wherein the RF coil further comprises a connector configured to connect the at least one fixer to the decompressor to allow a movement of air between the at least one fixer and the transport table, one end of the connector being connected to a combining boss formed in the second frame.

7. The MRI device of claim 1,
   wherein the at least one fixer comprises a nonmagnetic substance.

8. The MRI device of claim 7,
   wherein the at least one fixer comprises at least one from among ceramic and thermosetting resin.

9. The MRI device of claim 1,
   wherein the at least one fixer is configured to detachably connect to the decompressor.

10. The MRI device of claim 9,
    wherein the RF coil further comprises a connector configured to detachably connect the at least one fixer to the decompressor to allow a movement of air between the at least one fixer and the transport table.

11. The MRI device of claim 10, wherein the connector further comprises: a valve configured to control the movement of the air toward the decompressor.

12. The MRI device of claim 11,
    wherein the connector comprises:
       a first connector configured to connect the decompressor to the valve; and
       a second connector configured to connect the at least one fixer to the valve,
       wherein the first connector is detachably connected to the valve.

13. The MRI device of claim 1, further comprising:
    a magnet assembly having a cavity into which the transport table is configured to slide,
    wherein the RF coil further comprises a connector configured to connect the at least one fixer to the decompressor by passing through at least one from among the magnet assembly and the transport table to allow a movement of air between the at least one fixer and the transport table.

14. The MRI device of claim 1,
    wherein the RF coil comprises:
       a connector configured to connect the at least one fixer to the decompressor to allow a movement of air between the at least one fixer and the transport table; and
       a cable configured to connect to an outlet for receiving power,
       wherein the connector is configured to be inserted into the cable such that the cable is connected to the outlet, the fixer, and the decompressor simultaneously.

15. A radio frequency (RF) coil comprising:
    a main body configured to receive an RF signal, the main body forming the exterior of the RF coil;
    at least one fixer installed on the main body, wherein a portion of the at least one fixer is exposed to an outer surface of the main body; and a decompressor connected to the at least one fixer, the decompressor being configured to detachably fix the main body onto a target face by decompressing the at least one fixer.

16. The RF coil of claim 15,
wherein the main body comprises a bottom surface facing the target face, and
wherein the at least one fixer is configured to be installed on the bottom surface of the main body.

17. The RF coil of claim 15,
wherein the at least one fixer comprises a contact face configured to contact the target face, and a plurality of holes formed on the contact face.

18. The RF coil of claim 15,
wherein the at least one fixer comprises a nonmagnetic substance.

19. The RF coil of claim 18,
wherein the at least one fixer comprises at least one from among ceramic and thermosetting resin.

20. The RF coil of claim 15,
wherein the at least one fixer is configured to detachably connect to the decompressor.

* * * * *